(12) United States Patent
Cook, Jr. et al.

(10) Patent No.: US 7,943,469 B2
(45) Date of Patent: May 17, 2011

(54) MULTI-COMPONENT STRAIN-INDUCING SEMICONDUCTOR REGIONS

(75) Inventors: Ted E. Cook, Jr., Hillsboro, OR (US);
Bernhard Sell, Portland, OR (US);
Anand Murthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1205 days.

(21) Appl. No.: 11/605,739

(22) Filed: Nov. 28, 2006

(65) Prior Publication Data

US 2008/0124878 A1 May 29, 2008

(51) Int. Cl.
*H01L 21/336* (2006.01)
(52) U.S. Cl. .......... 438/300; 257/E21.619; 257/E21.634
(58) Field of Classification Search .......... 438/299–301; 257/E21.619, E21.634
See application file for complete search history.

(56) References Cited

U.S. PATENT DOCUMENTS

| | | | |
|---|---|---|---|
| 6,960,781 B2 | 11/2005 | Currie et al. | |
| 2006/0088968 A1* | 4/2006 | Shin et al. | 438/299 |
| 2006/0131665 A1 | 6/2006 | Murthy | |
| 2006/0134872 A1 | 6/2006 | Hattendorf | |
| 2006/0148151 A1 | 7/2006 | Murthy | |
| 2007/0190731 A1* | 8/2007 | Chen et al. | 438/299 |

OTHER PUBLICATIONS

U.S. Appl. No. 10/993,865, filed Nov. 18, 2004, Murthy.
U.S. Appl. No. 11/386,518, filed Mar. 21, 2006, Liu.
U.S. Appl. No. 11/387,012, filed Mar. 21, 2006, Rachmady.
U.S. Appl. No. 11/521,850, filed Sep. 14, 2006, Murthy.

* cited by examiner

*Primary Examiner* — Brook Kebede
(74) *Attorney, Agent, or Firm* — Blakely, Sokoloff, Taylor & Zafman LLP

(57) ABSTRACT

A multi-component strain-inducing semiconductor region is described. In an embodiment, formation of such a strain-inducing semiconductor region laterally adjacent to a crystalline substrate results in a uniaxial strain imparted to the crystalline substrate, providing a strained crystalline substrate. In one embodiment, the multi-component strain-inducing material region comprises a first portion and a second portion which are separated by an interface. In a specific embodiment, the concentration of charge-carrier dopant impurity atoms of the two portions are different from one another at the interface.

18 Claims, 14 Drawing Sheets

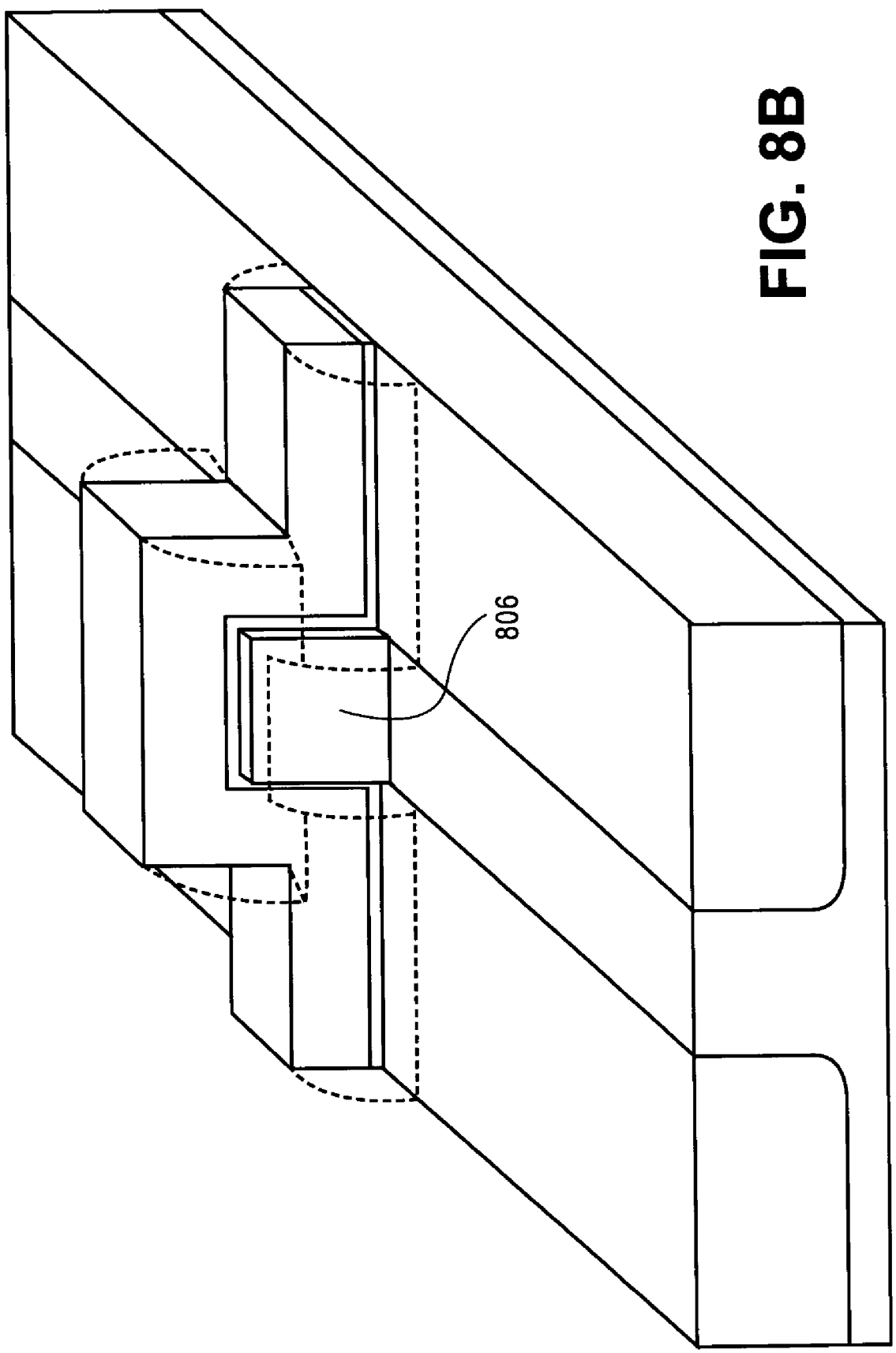

ns/drain regions 120 are formed by
MULTI-COMPONENT STRAIN-INDUCING SEMICONDUCTOR REGIONS

BACKGROUND OF THE INVENTION

1) Field of the Invention

The invention is in the field of Semiconductor Devices.

2) Description of Related Art

For the past several years, the performance of semiconductor devices, such as Metal Oxide Semiconductor Field-Effect Transistors (MOS-FETs), has been greatly enhanced by the incorporation of strained silicon regions into the active portions of a semiconductor substrate, e.g. the use of strained silicon channel regions to enhance carrier mobility. FIG. 1 depicts a typical strained MOS-FET 100 fabricated on a substrate 102. A gate dielectric layer 104 sits above a channel region 106 and a gate electrode 108 sits above gate dielectric layer 104. Gate dielectric layer 104 and gate electrode 108 are isolated by gate isolation spacers 110. Tip extensions 112 are formed by implanting dopant atoms into substrate 102. Strain-inducing source/drain regions 120 are formed by selectively growing an epitaxial film in etched-out portions of substrate 102 and are doped either in situ or after epitaxial film growth, or both. In typical MOS-FETs, the channel region 106 is comprised of crystalline silicon, while the strain-inducing source/drain regions 120 are comprised of epitaxial silicon/germanium (P-type MOSFET) or carbon-doped silicon (N-type MOS-FET) which have lattice constants different than that of crystalline silicon. Strain-inducing source/drain regions 120 can impart a uniaxial compressive (P-type) or tensile (N-type) strain to the channel region 106. Such a uniaxial strain can enhance the hole mobility or electron mobility, respectively, in channel region 106 of MOS-FET 100, lending to improved performance of the device.

FIGS. 2A-C illustrate a typical process flow for forming strain-inducing source/drain regions in a MOS-FET. Referring to FIG. 2A, a non-strained MOS-FET 200 is first formed. Non-strained MOS-FET 200 is comprised of a channel region 206. A gate dielectric layer 204 sits above the channel region 206 and a gate electrode 208 sits above gate dielectric layer 204. Gate dielectric layer 204 and gate electrode 208 are isolated by gate isolation spacer 210. Tip extensions 212 and source/drain regions 214 are formed by implanting dopant atoms into substrate 202. Thus, the source/drain regions 214 are initially formed from the same material as the channel region 206. Therefore, the lattice mismatch between the source/drain regions 214 and the channel region 206 is negligible, resulting in effectively no strain on the channel region 206.

Referring to FIG. 2B, portions of substrate 202, including source/drain regions 214, are removed, e.g. by an etch process, to form recessed regions 216 in substrate 202. Subsequently, strain-inducing silicon/germanium or carbon-doped silicon source/drain regions 220 are formed by selectively growing an epitaxial film into recessed regions 216, as depicted in FIG. 2C. Strain-inducing source/drain regions 220 can be doped with charge-carrier atoms, which may be done in situ or after epitaxial film growth, or both. In an example, substrate 202, and hence channel region 206, is comprised of crystalline silicon and the film grown to form strain-inducing source/drain regions 220 is comprised of epitaxial silicon/germanium. The lattice constant of the epitaxial silicon/germanium film can be greater than that of crystalline silicon by a factor of ~1% (for 70% Si, 30% Ge) and so strain-inducing silicon/germanium source/drain regions 220 are comprised of a material with a larger lattice constant than that of the channel region 206.

The concentration of charge-carrier dopant impurity atoms in strain-inducing regions may play a role in the performance of MOS-FETs having such strain-inducing regions. For example, if the concentration is high, a good contact resistance may be achieved, but at the expense of short-channel effects. On the other hand, if the concentration is low, short-channel effects may be optimized, but at the expense of an increased contact resistance. Thus, multi-component strain-inducing regions, and a method to fabricate these regions, is described herein.

BRIEF DESCRIPTION OF THE DRAWINGS

FIGS. 8A-D illustrate cross-sectional views representing the formation of multi-component strain-inducing source/drain regions in a tri-gate device, in accordance with an embodiment of the present invention.

DETAILED DESCRIPTION

Figure 1:
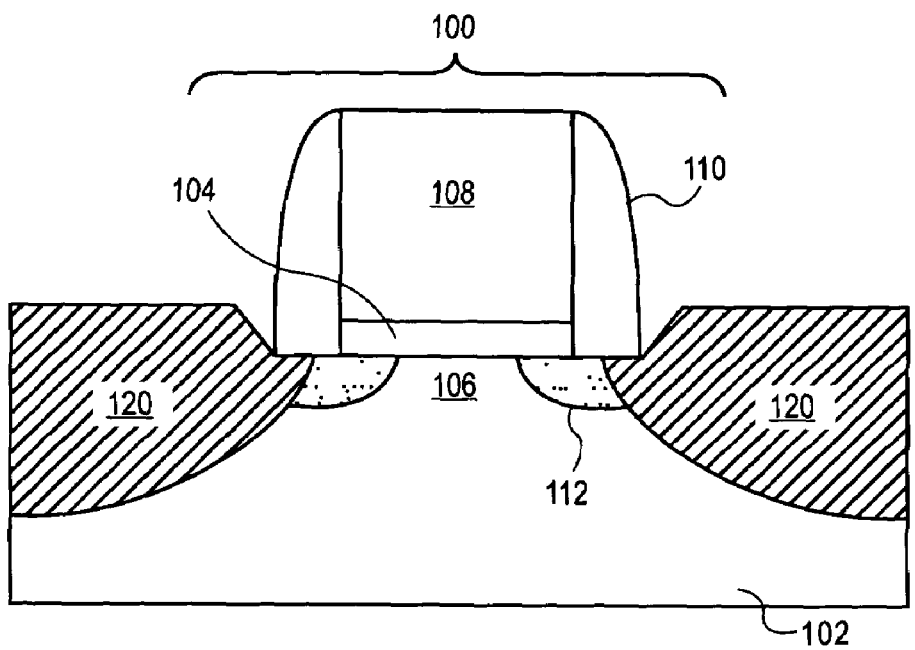
FIG. 1 illustrates a cross-sectional view of a strained Metal Oxide Semiconductor Field-Effect Transistor (MOS-FET), in accordance with the prior art.
Figure 2A:
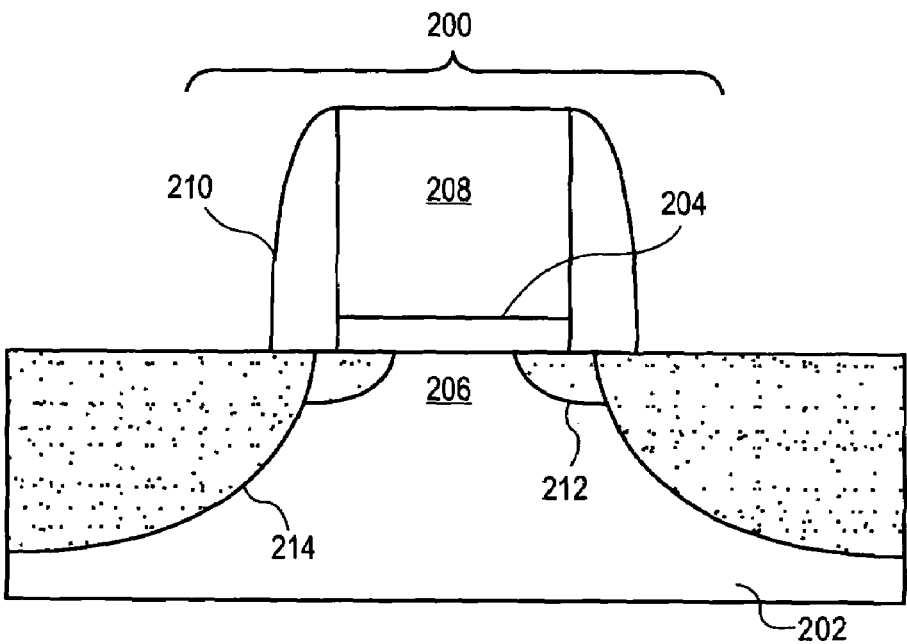
FIGS. 2A-C illustrate cross-sectional views representing the formation of a MOS-FET device with strain-inducing source/drain regions, in accordance with the prior art.
Figure 2B:
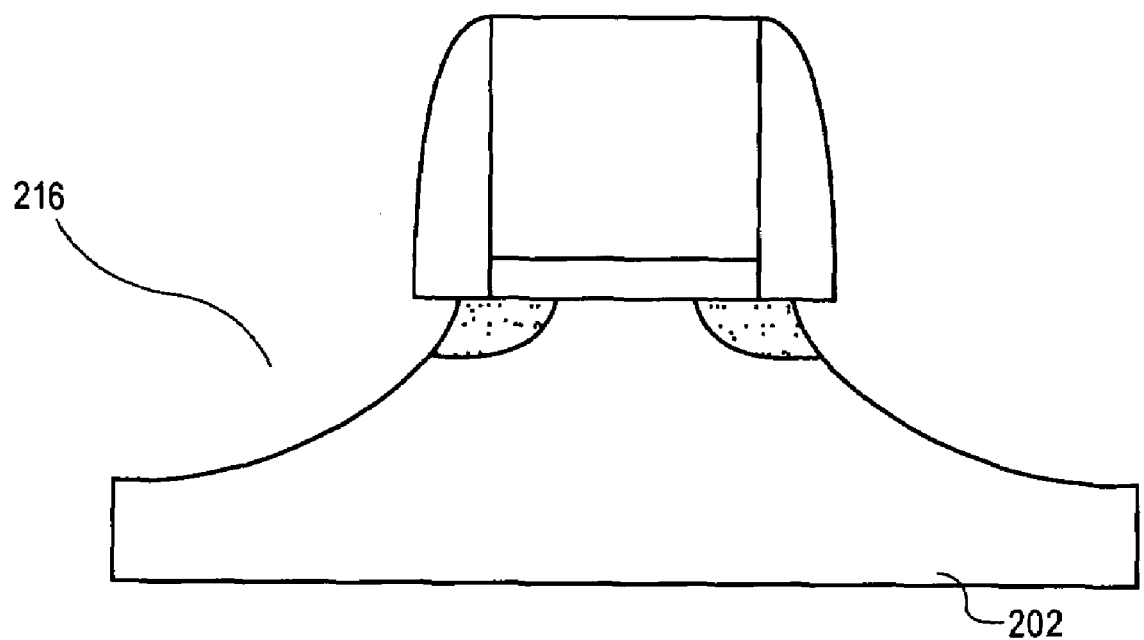
Figure 2C:
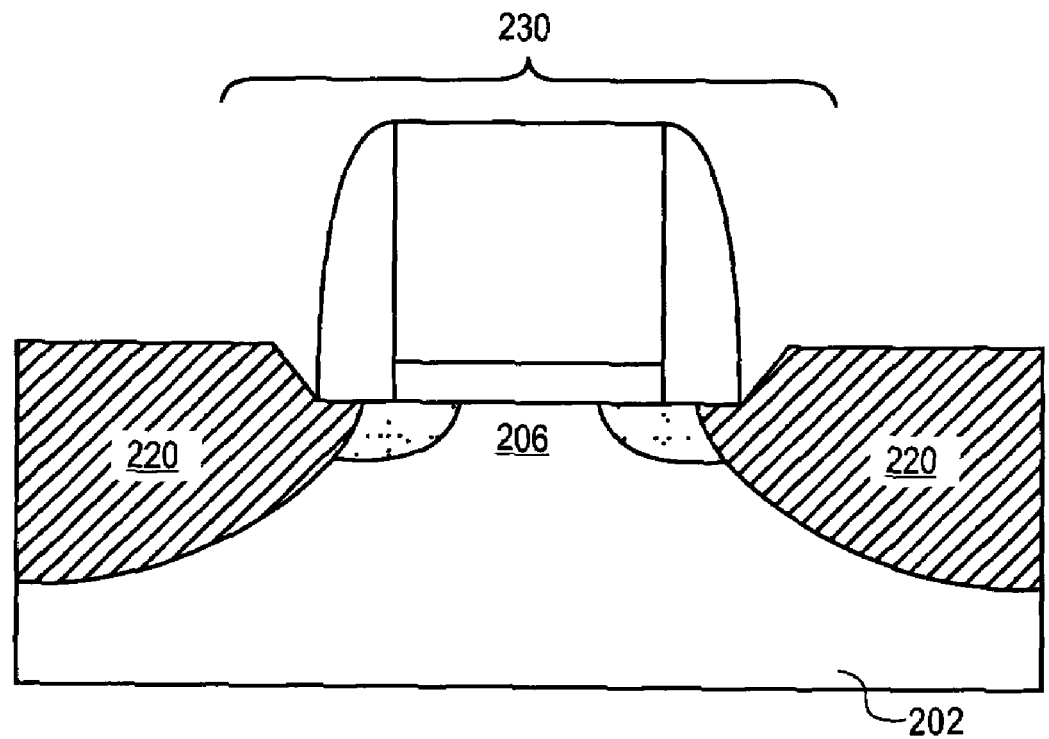

A process for fabricating semiconductor devices and the resultant devices are described. In the following description, numerous specific details are set forth, such as specific dimensions and chemical regimes, in order to provide a thorough understanding of the present invention. It will be apparent to one skilled in the art that the present invention may be practiced without these specific details. In other instances, well-known processing steps, such as patterning steps or wet chemical cleans, are not described in detail in order to not unnecessarily obscure the present invention. Furthermore, it is understood that the various embodiments shown in the figures are illustrative representations and are not necessarily drawn to scale.

Disclosed herein is a semiconductor structure comprising a strained region of a substrate and a multi-component strain-inducing material region laterally adjacent to the strained region. The strain-inducing material region comprises a first portion and a second portion, which are separated by an interface. The lattice constants of the two portions of the strain-inducing material region may be different from the lattice constant of the strained region of the substrate. Additionally, the concentration of charge-carrier dopant impurity atoms of the two portions may be different from one another at the interface.

A MOS-FET that comprises a multi-component strain-inducing source/drain region laterally adjacent to a channel region may exhibit an enhanced carrier mobility in the channel region when in an ON state, a result of the channel region being beneficially strained. Further optimization of such a device may be achieved by tuning the concentration of charge-carrier dopant impurity atoms in the multi-component strain-inducing source/drain region. For example, a higher concentration of charge-carrier dopant impurity atoms may lead to a reduced external resistance exhibited upon making contact to the source/drain region. This reduction in external resistance, however, may come at the expense of a greater amount of diffusion of charge-carrier dopant impurity atoms into the channel region, degrading short-channel effects. On the other hand, a lower concentration of charge-carrier dopant impurity atoms may lead to improved short-channel effects, but at the expense of an increased external resistance at contact. Thus, in accordance with an embodiment of the present invention, a strain-inducing source/drain region is comprised of a first portion and a second portion. The second portion has a greater concentration of charge-carrier dopant impurity atoms than does the first portion. The strain-inducing source/drain region is incorporated into a semiconductor device such that the first portion is directly adjacent to a channel region and in between the channel region and the second portion. A MOS-FET is fabricated wherein contact is made at the second, higher dopant-concentration portion of the strain-inducing source/drain region while the first, lower dopant-concentration portion is adjacent to the channel region.

Figure 3:
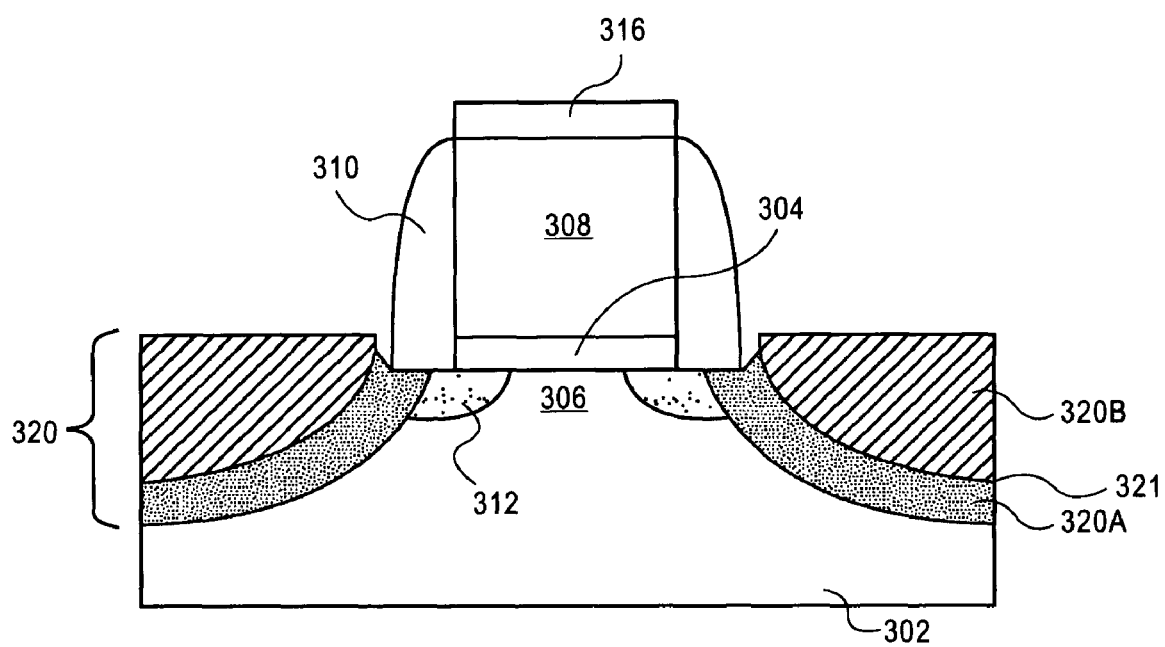
FIG. 3 illustrates a cross-sectional view of a semiconductor device incorporating multi-component strain-inducing source/drain regions, in accordance with an embodiment of the present invention.

A semiconductor device may include a multi-component strain-inducing material region. FIG. 3 illustrates a cross-sectional view of a semiconductor device that incorporates multi-component strain-inducing source/drain regions, in accordance with an embodiment of the present invention.

Referring to FIG. 3, a two-component strain-inducing source/drain region 320 is included in a substrate 302. A gate stack including gate dielectric layer 304, gate electrode 308, gate isolation spacers 310 and gate protection layer 316 sit above substrate 302 and in between two-component strain-inducing source/drain regions 320. A pair of tip extensions 312 defines a channel region 306.

Substrate 302 may comprise any semiconductor material that can withstand a manufacturing process and in which charge can migrate. In an embodiment, substrate 302 is comprised of group IV-based materials such as crystalline silicon, germanium or silicon/germanium. In one embodiment, the concentration of silicon atoms in substrate 302 is greater than 99%. In another embodiment, substrate 302 is comprised of a III-V material such as, but not limited to, gallium nitride, gallium phosphide, gallium arsenide, indium phosphide, indium antimonide, indium gallium arsenide, aluminum gallium arsenide, indium gallium phosphide or a combination thereof. In an alternative embodiment, substrate 302 is comprised of an epitaxial layer grown atop a distinct crystalline substrate, e.g. a silicon epitaxial layer grown atop a boron-doped bulk silicon mono-crystalline substrate. Substrate 302 may also comprise an insulating layer in between a bulk crystal substrate and an epitaxial layer to form, for example, a silicon-on-insulator substrate. In one embodiment, the insulating layer is comprised of a material selected form the group consisting of silicon dioxide, silicon nitride, silicon oxy-nitride or a high-k dielectric layer.

Substrate 302 may additionally comprise charge-carrier dopant impurity atoms. For example, in accordance with an embodiment of the present invention, substrate 302 is comprised of silicon and/or germanium and the charge-carrier dopant impurity atoms are selected from the group consisting of boron, arsenic, indium, antimony or phosphorus. In another embodiment, substrate 302 is comprised of a III-V material and the charge-carrier dopant impurity atoms are selected from the group consisting of carbon, silicon, germanium, oxygen, sulfur, selenium or tellurium.

Two-component strain-inducing source/drain region 320 is comprised of a first portion 320A and a second portion 320B. First portion 320A may be adjacent channel region 306 and in between channel region 306 and second portion 320B, as depicted in FIG. 3. First portion 320A and second portion 320B of two-component strain-inducing source/drain region 320 may comprise any crystalline semiconductor material in which charge can migrate, but they need not comprise the same material. In an embodiment, portions 320A and 320B are comprised of group IV-based materials such as crystalline silicon, germanium, silicon/germanium or carbon-doped silicon. In another embodiment, portions 320A and 320B are comprised of a III-V material such as, but not limited to, gallium nitride, gallium phosphide, gallium arsenide, indium phosphide, indium antimonide, indium gallium arsenide, aluminum gallium arsenide, indium gallium phosphide or a combination thereof. Two-component strain-inducing source/drain region 320 may be of a thickness (i.e. a vertical depth) sufficient to maximize charge-carrier efficiency when a semiconductor device is in an ON-state. In one embodiment, two-component strain-inducing source/drain region 320 has a thickness in the range of 500-1600 Angstroms. In another embodiment, the ratio of the thickness of two-component strain-inducing source/drain region 320 to the gate length of gate electrode 308 (i.e. the width of the cross-section of 308 shown in FIG. 3) is in the range of 3-6:1.

The lattice constants of first portion 320A and second portion 320B may be different from the lattice constant of substrate 302 and, hence, different from the lattice constant of channel region 306. The lattice constants of each material are based on the atomic spacings and the unit cell orientations of that particular material. Thus, in accordance with an embodiment of the present invention, the lattice constant of substrate 302 is different from the lattice constant of two-component strain-inducing source/drain region 320 and a strain is imparted to substrate 302 and, hence, to channel region 306. In an embodiment, the lattice constants of portions 320A and 320B are similar to one another and differ from the lattice constant of substrate 302 by a factor of at least 0.2%. In one embodiment, the lattice constants of portions 320A and 320B are similar to one another and are smaller than the lattice constant of substrate 302 and, so, a tensile strain is imparted to channel region 306. In a specific embodiment, a tensile strain is imparted to channel region 306 of an N-type MOS-FET, enhancing electron mobility in the device. In another embodiment, the lattice constants of portions 320A and 320B are similar to one another and are greater than the lattice constant of substrate 302 and, so, a compressive strain is imparted to channel region 306. In a specific embodiment, a compressive strain is imparted to channel region 306 of a P-type MOS-FET, enhancing hole mobility in the device. In an alternative embodiment of the present invention, the lattice constants of portions 320A and 320B are significantly different from one another, but the effective lattice constant (i.e. the lattice constant experienced by the adjacent channel region 306) of two-component strain-inducing source/drain region 320 is different from the lattice constant of channel region 306 by a factor of at least 0.2%. In one embodiment, substrate 302 is comprised of silicon and two-component strain-inducing source/drain region 320 is comprised of silicon/germanium, wherein the atomic concentration of germanium atoms in second portion 320B is greater than the atomic concentration of germanium atoms in first portion 320A by a factor of at least 10%. In another embodiment, substrate 302 is comprised of silicon and two-component strain-inducing source/drain region 320 is comprised of carbon-doped silicon, wherein the atomic concentration of carbon atoms in second portion 320B is greater than the atomic concentration of carbon atoms in first portion 320A by a factor of at least 10%.

Two-component strain-inducing source/drain region 320 may comprise charge-carrier dopant impurity atoms of a conductivity type opposite from that of substrate 302 and, hence, channel region 306. For example, in accordance with an embodiment of the present invention, substrate 302 is comprised of silicon and/or germanium with boron or indium (i.e. P-type) charge-carrier dopant impurity atoms and two-component strain-inducing source/drain region 320 comprises silicon and/or germanium with charge-carrier dopant impurity atoms selected from the group consisting of arsenic, antimony or phosphorus (i.e. N-type). In an alternative embodiment, substrate 302 is comprised of silicon and/or germanium with arsenic, antimony or phosphorus charge-carrier dopant impurity atoms and two-component strain-inducing source/drain region 320 comprises silicon and/or germanium with charge-carrier dopant impurity atoms selected from the group consisting of boron or indium. In accordance with another embodiment of the present invention, substrate 302 is comprised of a III-V material with carbon, silicon or germanium (i.e. P-type) charge-carrier dopant impurity atoms and two-component strain-inducing source/drain region 320 comprises a III-V material with charge-carrier dopant impurity atoms selected from the group consisting of oxygen, sulfur, selenium or tellurium (i.e. N-type). In an alternative embodiment, substrate 302 is comprised of a III-V material with oxygen, sulfur, selenium or tellurium charge-carrier dopant impurity atoms and two-component strain-inducing source/drain region 320 comprises a III-V material with charge-carrier dopant impurity atoms selected from the group consisting of carbon, silicon or germanium.

The concentration of charge-carrier dopant impurity atoms in each of the portions 320A and 320B of two-component strain-inducing source/drain region 320 may be different in order to optimize the performance of a semiconductor device. For example, in accordance with an embodiment of the present invention, the concentration of charge carrier dopant impurity atoms in portion 320A is less than the concentration in portion 320B. Thus, a semiconductor device may be fabricated having a two-component strain-inducing source/drain region 320 with a first portion 320A adjacent to a channel region 306, wherein diffusion of charge-carrier dopant impurity atoms from first portion 320A into channel region 306 is mitigated. In the same device, contact made to the second portion 320B may exhibit a reduced external resistance, a result of the presence of a higher concentration of charge-carrier dopant impurity atoms. In an embodiment, an interface 321 is between portions 320A and 320B. As opposed to a gradient, a step function (i.e. non-gradient) concentration of charge-carrier dopant impurity atoms may thus be formed. In one embodiment, the concentration of charge-carrier dopant impurity atoms in portion 320B at interface 321 is greater than the concentration of charge-carrier dopant impurity atoms in portion 320A at interface 321 by a factor of at least two. In an alternative embodiment, the concentration of charge-carrier dopant impurity atoms in second portion 320B is in the range of $5\times10^{20}$-$5\times10^{21}$ atoms/cm$^3$ and the concentration of charge-carrier dopant impurity atoms in first portion 320A is in the range of $1\times10^{18}$-$1\times10^{20}$ atoms/cm$^3$. In a specific embodiment, substrate 302 is comprised of silicon with N-type charge-carrier dopant impurity atoms, first portion 320A and second portion 320B are both comprised of silicon/germanium with a substantially similar atomic concentration of germanium atoms, and the concentration of boron charge-carrier dopant impurity atoms in second portion 320B is in the range of $1\times10^{21}$-$5\times10^{21}$ atoms/cm$^3$, while the concentration of boron charge-carrier dopant impurity atoms in first portion 320A is in the range of $5\times10^{18}$-$5\times10^{19}$ atoms/cm$^3$. In an alternative embodiment of the present invention, the concentration of charge-carrier dopant impurity atoms in portions 320A and 320B are substantially similar, but portion 320B is comprised of a material with a lower band gap than that of first portion 320A. For example, in one embodiment, substrate 302 is comprised of silicon with N-type charge-carrier dopant impurity atoms, first portion 320A is comprised of silicon/germanium with an atomic concentration of Ge atoms in the range of 20-25%, second portion 320B is comprised of silicon/germanium with an atomic concentration of Ge atoms in the range of 25-35%, and the concentration of boron charge-carrier dopant impurity atoms for both portions 320A and 320B is in the range of $1\times10^{19}$-$1\times10^{20}$ atoms/cm$^3$.

The thicknesses (i.e. vertical depths) of each of the portions 320A and 320B of two-component strain-inducing source/drain region 320 may be selected in order to optimize the performance of a semiconductor device. For example, in accordance with an embodiment of the present invention, first portion 320A is of a thickness sufficient to impede a significant diffusion of charge-carrier dopant impurity atoms from second portion 320B into channel region 306. In one embodiment, two-component strain-inducing source/drain region 320 has a thickness of approximately 1000 Angstroms and first portion 320A has a thickness in the range of 200-400 Angstroms. In another embodiment, the ratio of the thickness of two-component strain-inducing source/drain region 320 to the gate length of gate electrode 308 (i.e. the width of the cross-section of 308 shown in FIG. 3) is in the range of 3-6:1 and the ratio of the thickness of first portion 320A to second portion 320B is in the range of 0.3-2:1.

Gate dielectric layer 304 may comprise any dielectric material suitable to insulate a gate electrode 308 from channel region 306. In an embodiment, gate dielectric layer 304 is comprised of an oxide layer of the semiconductor material of substrate 302. For example, in a specific embodiment, substrate 302 is comprised of silicon and gate dielectric layer 304 is comprised of silicon dioxide or silicon oxy-nitride. In another embodiment, gate dielectric layer 304 is comprised of a high-K dielectric layer. In one embodiment, the high-K dielectric layer is selected from the group consisting of hafnium oxide, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate or a combination thereof.

Gate electrode 308 may be comprised of any material suitable to conduct a current and may be formed by a subtractive etching process scheme or by a replacement gate process scheme. In one embodiment, gate electrode 308 is comprised of a doped polycrystalline silicon gate electrode, wherein the charge-carrier dopant impurities are implanted during fabrication of the tip and source/drain regions. In another embodiment, gate electrode 308 is comprised of a metal layer such as but not limited to metal nitrides, metal carbides, hafnium, zirconium, titanium, tantalum, aluminum, ruthenium, palladium, platinum, cobalt, nickel or conductive metal oxides, e.g. ruthenium oxide.

Gate protection layer 316 and gate isolation spacers 310 may comprise any materials suitable to isolate gate electrode 308. The same species of material, however, need not be used for both. In an embodiment, gate protection layer 316 and gate isolation spacers 310 are comprised of insulating materials. In a particular embodiment, gate protection layer 316 and gate isolation spacers 310 are comprised of a material selected from the group consisting of silicon dioxide, silicon oxy-nitride, carbon-doped silicon oxide, silicon nitride or carbon-doped silicon nitride.

The pair of tip extensions 312 comprises portions of substrate 302 that incorporate charge-carrier dopant impurity atoms of a conductivity type opposite to that of substrate 302. For example, in accordance with an embodiment of the present invention, substrate 302 is comprised of silicon and/or germanium with boron or indium (i.e. P-type) charge-carrier dopant impurity atoms and tip extensions 312 comprise charge-carrier dopant impurity atoms selected from the group consisting of arsenic, antimony or phosphorus (i.e. N-type). In an alternative embodiment, substrate 302 is comprised of silicon and/or germanium with arsenic, antimony or phosphorus charge-carrier dopant impurity atoms and tip extensions 312 comprise charge-carrier dopant impurity atoms selected from the group consisting of boron or indium. In accordance with another embodiment of the present invention, substrate 302 is comprised of a III-V material with carbon, silicon or germanium (i.e. P-type) charge-carrier dopant impurity atoms and tip extensions 312 comprise charge-carrier dopant impurity atoms selected from the group consisting of oxygen, sulfur, selenium or tellurium (i.e. N-type). In an alternative embodiment, substrate 302 is comprised of a III-V material with oxygen, sulfur, selenium or tellurium charge-carrier dopant impurity atoms and tip extensions 312 comprise charge-carrier dopant impurity atoms selected from the group consisting of carbon, silicon or germanium.

Channel region 306 may comprise a portion of substrate 302, as depicted in FIG. 3. In accordance with an embodiment of the present invention, channel region 302 has a conductivity type (i.e. N-type or P-type) opposite to the conductivity type of tip extensions 312, two-component source/drain regions 320 and gate electrode 308. Channel region 306 may be a strained channel region. For example, in accordance with an embodiment of the present invention, two-component strain-inducing source/drain regions 320 impart a uniaxial strain to channel region 306.

A multi-component strain-inducing material region may be formed in a semiconductor structure. FIGS. 4A-F illustrate cross-sectional views representing the formation of a multi-component strain-inducing semiconductor region in an etched-out region of a crystalline substrate, in accordance with an embodiment of the present invention.

Figure 4A:
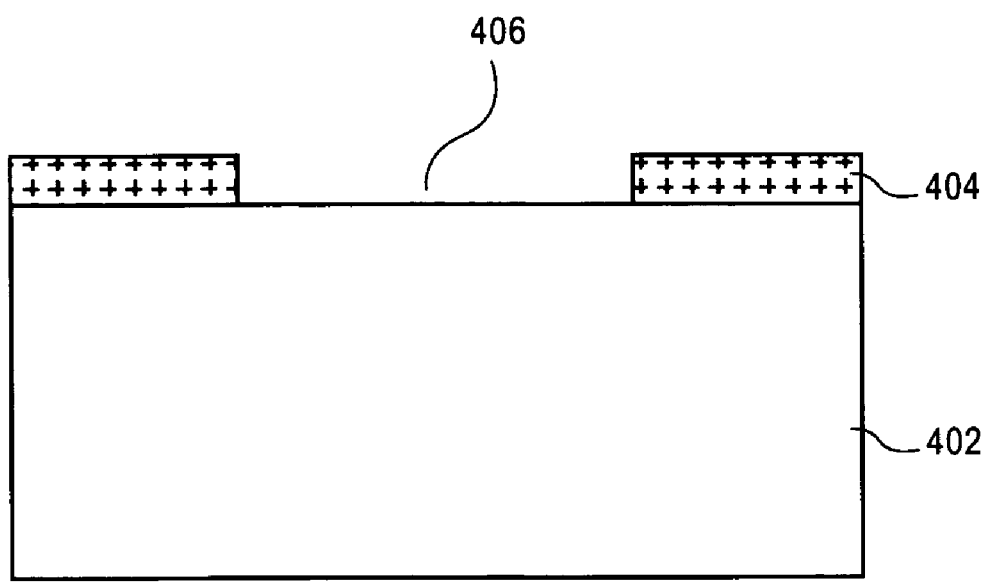
FIGS. 4A-F illustrate cross-sectional views representing the formation of a multi-component strain-inducing semiconductor region in an etched-out region of a crystalline substrate, in accordance with an embodiment of the present invention.
Figure 4B:
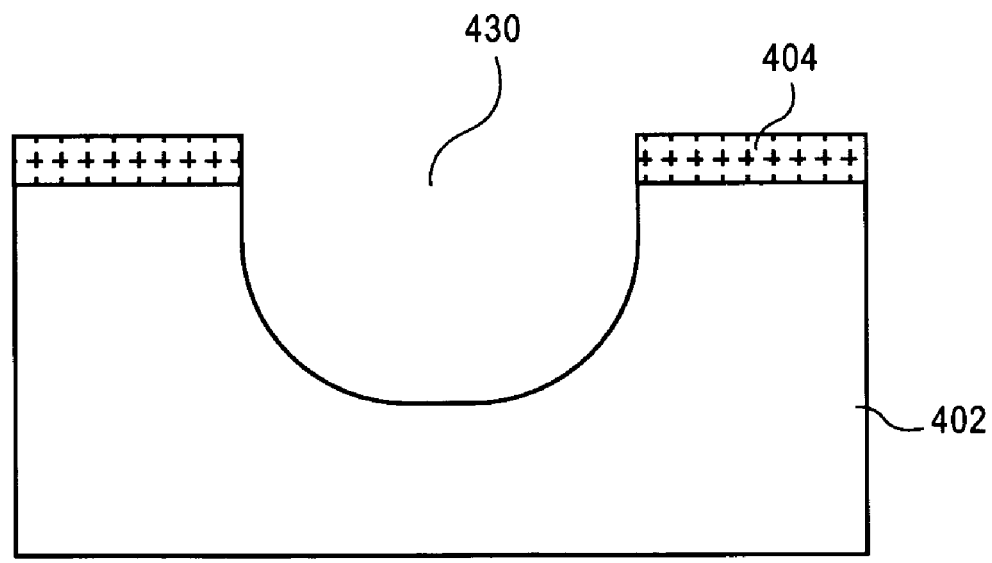

Referring to FIG. 4A, a dielectric layer 404 is patterned above a substrate 402 to create an opening 406. Substrate 402 may be comprised of any material discussed in association with substrate 302 from FIG. 3. Referring to FIG. 4B, a portion of substrate 402 not protected by dielectric layer 404 is removed to form etched-out region 430. Etched-out region 430 may be formed by any technique suitable to selectively remove a portion of substrate 402 without significantly impacting dielectric layer 404, such as a dry etch or a wet etch process. In an embodiment, etched-out region 430 is formed isotropically, leaving etched-out region 430 with curvature, as depicted in FIG. 4B. In one embodiment, etched-out region 430 is formed by a dry plasma etch step utilizing gases selected from the group consisting of $NF_3$, HBr, $SF_6$/Cl or $Cl_2$. In an alternative embodiment, portions of substrate 402 are removed uniformly, leaving an etched-out region with equal depth in all locations. In another embodiment, a wet etch step utilizing aqueous solutions of $NH_4OH$ or tetramethylammonium hydroxide is used to form etched-out region 430. In one embodiment, these wet etchants are inhibited by high density planes of substrate 402 (e.g. the <111> plane in a silicon substrate), and etched-out region 430 thus assumes a tapered profile. In a specific embodiment, etched-out region 430 is formed by applying an aqueous solution of $NH_4OH$ with a concentration in the range of 10-30% at a temperature in the range of 20-35 degrees Celsius to a substrate 402 comprised of crystalline silicon and a tapered profile results with a surface angle of 55 degrees.

Figure 4C:
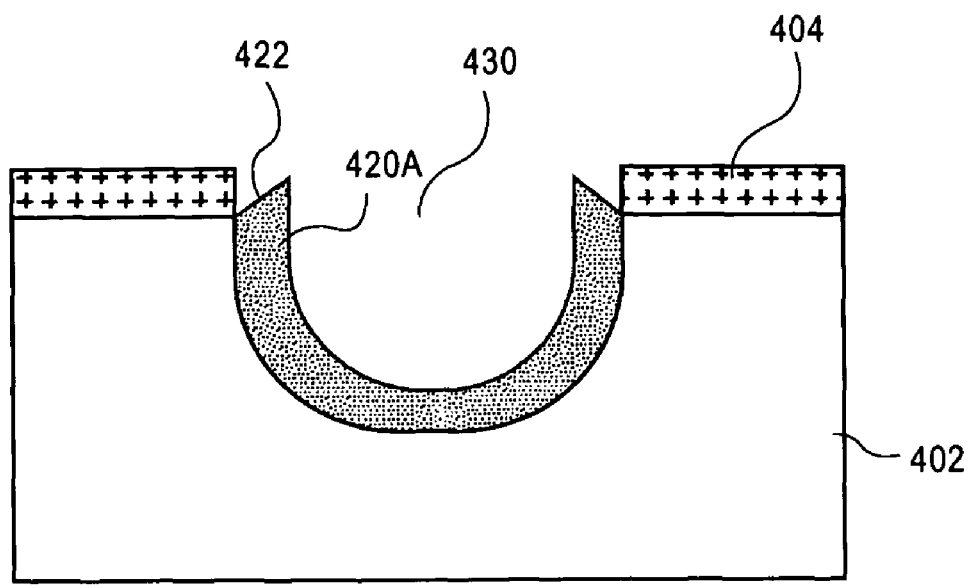

Referring to FIG. 4C, a first portion 420A of a multi-component strain-inducing material region is formed in etched-out region 430. In accordance with an embodiment of the present invention, first portion 420A is formed selectively on the exposed surface of substrate 402, but not on dielectric layer 404, as depicted in FIG. 4C. In a specific embodiment, first portion 420 is a faceted epitaxial layer, also depicted in FIG. 4C, wherein facets 422 are formed as a result of energetic repulsion from dielectric layer 404. Thus, dielectric layer 404 should be of sufficiently high polarity to inhibit growth of first portion 420A thereon. In an embodiment, dielectric layer 404 is comprised of a dielectric material with surface atomic interactions having a difference in Pauling's values of greater than 1. In one embodiment, dielectric layer 404 is comprised of silicon dioxide (where Pauling's value for electronegativity for Si is 1.8 and for O is 3.5, and thus an Si—O bond has a value of ~1.7), silicon nitride (where Pauling's value for electronegativity for Si is 1.8 and for N is 3, and thus an Si—N bond has a value of ~1.2), silicon oxy-nitride or carbon-doped silicon nitride.

First portion 420A may be comprised of any material and may be formed to any thickness discussed in association with first portion 320A from FIG. 3. First portion 420A may be formed by any method that favors growth on a low polarity substrate 402, but not on dielectric layer 404, and may be doped in situ (i.e. during the deposition) with charge-carrier dopant impurity atoms. For example, in accordance with an embodiment of the present invention, first portion 420A is formed by an epitaxial process conducted in a single wafer reactor. In one embodiment, first portion 420A comprises silicon and/or germanium and is deposited utilizing the gaseous precursors $SiH_2Cl_2$ and/or $GeH_4$, respectively. In a specific embodiment, first portion 420 is comprised of boron-doped silicon/germanium in a 70:30 Si:Ge ratio with a boron concentration in the range of $5\times10^{18}$-$5\times10^{19}$ atoms/$cm^3$ and is deposited by flowing the gases $SiH_2Cl_2$, HCl, $B_2H_6$ and $GeH_4$ in an $H_2$ carrier gas with a process pressure in the range of 5-760 Torr. In an embodiment, the gases are flowed in a laminar flow over a rotating wafer with a rotation speed in the range of 20-50 rpm. In a specific embodiment, first portion 420 is deposited by flowing an appropriate ratio of a first mixture of gases comprising 20-200 sccm of $SiH_2Cl_2$, 30-200 sccm of HCl, 30-150 sccm of 1% $GeH_4$ diluted in $H_2$ and 20-60 slm of $H_2$ and a second mixture of gases comprising 275-325 sccm $B_2H_6$ and 3.3-3.9 slm $H_2$ at a temperature in the range of 725-800 degrees Celsius with a process pressure in the range of 45-55 Torr.

In another embodiment, first portion 420A is comprised of a III-V material and is deposited utilizing gaseous precursors selected from the group consisting of X(CH$_3$)$_3$ (where X=Al, Ga, In) and YH$_3$ (where Y=N, P, As, Sb). In an alternative embodiment, charge-carrier dopant impurity atoms are incorporated by ion implantation following the deposition of first portion 420A. In an embodiment, immediately prior to the deposition of first portion 420A, the exposed surface of substrate 402 may be cleaned with a wet chemical cleaning process step that comprises the application of an aqueous solution of hydrofluoric acid, ammonium fluoride or both. In another embodiment, a thin buffer layer is deposited prior to the deposition of first portion 420A. In a specific embodiment, the thin buffer layer is less than 100 Angstroms thick and is deposited by flowing an appropriate ratio of a first mixture of gases comprising 20-200 sccm of SiH$_2$Cl$_2$, 30-200 sccm of HCl, 30-45 sccm of 1% GeH$_4$ diluted in H$_2$ and 20-60 slm of H$_2$ and a second mixture of gases comprising 275-325 sccm B$_2$H$_6$ and 3.3-3.9 slm H$_2$ at a temperature in the range of 725-800 degrees Celsius with a process pressure in the range of 45-55 Torr. In one embodiment, the thin buffer layer inhibits defect formation in first portion 420A.

Figure 4D:
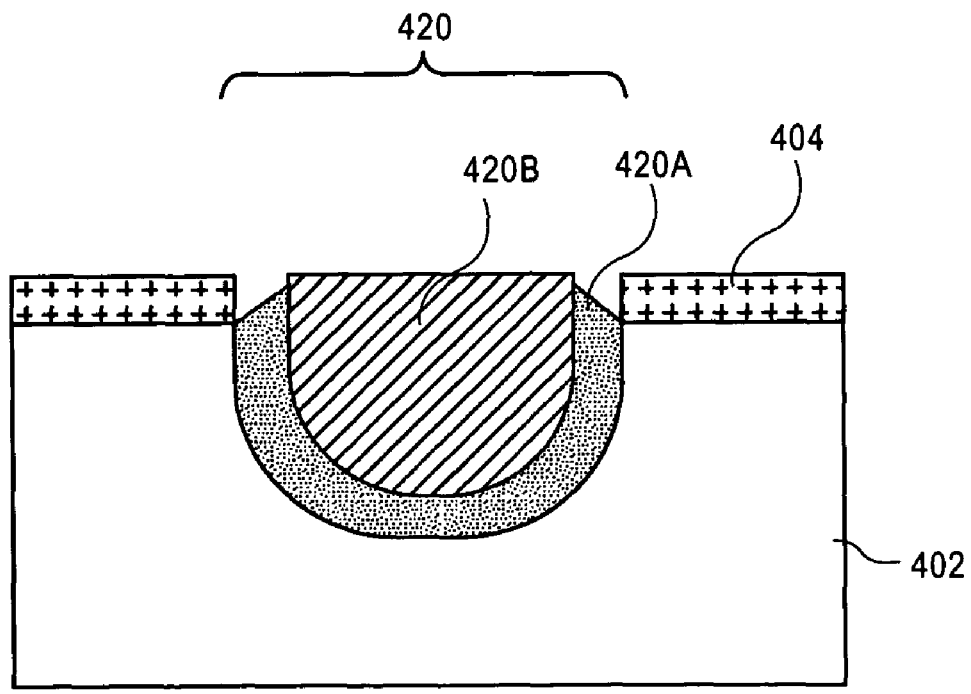

Referring to FIG. 4D, a second portion 420B of multi-component strain-inducing material region 420 is deposited directly above first portion 420A. Second portion 420B may be comprised of any material and may be formed to any thickness discussed in association with second portion 320B from FIG. 3. Second portion 420B may be formed by any method that favors growth on first portion 420A, but not on dielectric layer 404, and may be doped in situ (i.e. during the deposition) with charge-carrier dopant impurity atoms. For example, in accordance with an embodiment of the present invention, second portion 420B is formed by an epitaxial process conducted in a chemical vapor deposition chamber, as discussed in association with the deposition of first portion 420A. In one embodiment, second portion 420B is deposited in the same CVD chamber immediately following (i.e. without removal from the chamber) the deposition of first portion 420A by dynamically (i.e. in real-time) changing the relative ratios of the deposition gases. In a specific embodiment, immediately following the deposition of first portion 420A comprising boron-doped silicon/germanium in a 70:30 Si:Ge ratio with a boron concentration in the range of $5\times10^{18}$-$5\times10^{19}$ atoms/cm$^3$, second portion 420B, comprised of boron-doped silicon/germanium in a 70:30 Si:Ge ratio with a boron concentration in the range of $1\times10^{21}$-$5\times10^{21}$ atoms/cm$^3$, is deposited by flowing an appropriate ratio of a first mixture of gases comprising 20-200 sccm of SiH$_2$Cl$_2$, 30-200 sccm of HCl, 30-150 sccm of 1% GeH$_4$ diluted in H$_2$ and 20-60 slm of H$_2$ and a second mixture of gases comprising 275-325 sccm B$_2$H$_6$ and 3.3-3.9 slm H$_2$ at a temperature in the range of 725-800 degrees Celsius with a process pressure in the range of 45-55 Torr. In accordance with an embodiment of the present invention, the ratio of the second mixture of gases to the first mixture of gases is greater for the deposition of second portion 420B than for first portion 420A. In an alternative embodiment, a wet chemical cleaning process step that comprises the application of an aqueous solution of hydrofluoric acid and/or ammonium fluoride is utilized between the deposition steps of first portion 420A and second portion 420B. In another embodiment, charge-carrier dopant impurity atoms are incorporated into second portion 420B by ion implantation following the deposition of second portion 420B. The relationships of lattice constants and concentrations of charge-carrier dopant impurity atoms among first portion 420A, second portion 420B and substrate 402 are the same as discussed in association with first portion 320A, second portion 320B and substrate 302 from FIG. 3B.

Figure 4E:
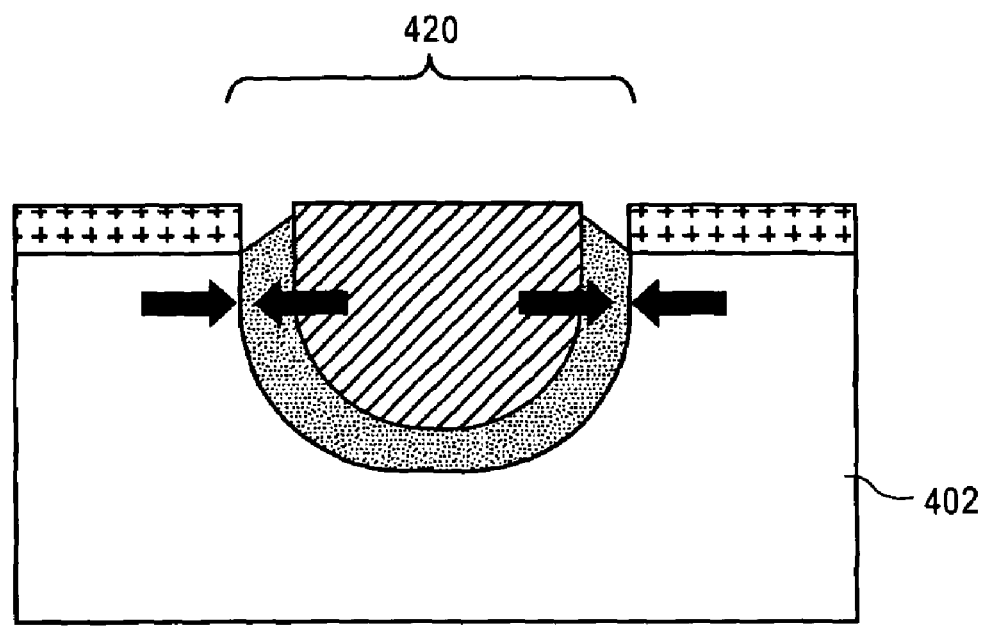
Figure 4F:
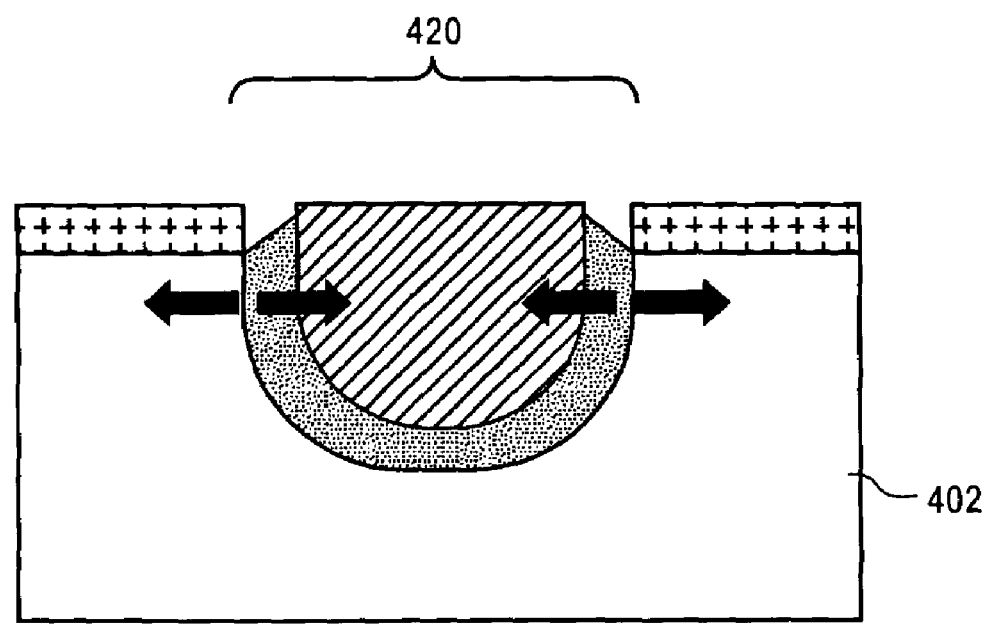

Thus, a semiconductor structure comprising a two-component strain-inducing material region 420 may be formed. In accordance with an embodiment of the present invention, a first portion 420A having a lower concentration of charge-carrier dopant impurity atoms that a second portion 420B is in between substrate 402 and second portion 420B. Referring to FIGS. 4E-F, two-component strain-inducing material region 420 may impart a uniaxial strain to substrate 402. In turn, substrate 402 may impart a uniaxial strain to strain-inducing material region 420. In one embodiment, the lattice constant of the strain-inducing material region 420 is smaller than the lattice constant of substrate 402 and imparts a tensile uniaxial strain, as depicted by the arrows in FIG. 4E. Thus, when the lattice constant of strain-inducing material region 420 that fills an etched-out portion of substrate 402 is smaller than the lattice constant of substrate 402, the lattice-forming atoms of strain-inducing material region 420 are pulled apart from their normal resting state and, hence, induce a tensile strain on substrate 402 as the atoms attempt to relax. In another embodiment, the lattice constant of the strain-inducing material region 420 is larger than the lattice constant of substrate 402 and imparts a compressive uniaxial strain, as depicted by the arrows in FIG. 4F. Thus, when the lattice constant of strain-inducing material region 420 that fills an etched-out portion of substrate 402 is larger than the lattice constant of substrate 402, the lattice-forming atoms of strain-inducing material region 420 are pushed together from their normal resting state and, hence, induce a compressive strain on substrate 402 as the atoms attempt to relax.

A multi-component strain-inducing material region may be formed in a semiconductor device. In one embodiment, the semiconductor device is a MOS-FET, a bipolar transistor, a memory transistor or a micro-electronic machine (MEM). For illustrative purposes, FIGS. 5A-F represent cross-sectional views depicting the formation of multi-component strain-inducing source/drain regions in a MOS-FET device, in accordance with an embodiment of the present invention.

Figure 5A:
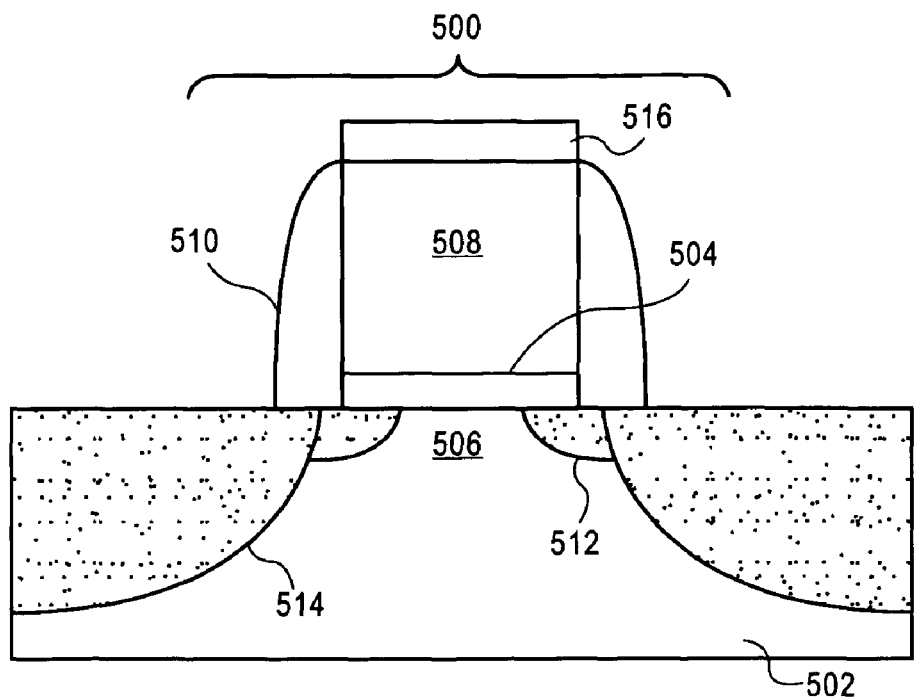
FIGS. 5A-F illustrate cross-sectional views representing the formation of multi-component strain-inducing source/drain regions in a MOS-FET device, in accordance with an embodiment of the present invention.

Referring to FIG. 5A, a non-strained MOS-FET 500 is first formed. Non-strained MOS-FET 500 is comprised of a channel region 506. A gate dielectric layer 504 sits above the channel region 506 and a gate electrode 508 sits above gate dielectric layer 504. Gate dielectric layer 504 and gate electrode 508 are isolated by gate isolation spacers 510. Gate protection layer 516 sits above gate electrode 508. Tip extensions 512 and sacrificial source/drain regions 514 are formed by implanting dopant atoms into substrate 502. Thus, the sacrificial source/drain regions 514 are formed from the same material as the channel region 506. Therefore, the lattice mismatch between the sacrificial source/drain regions 514 and the channel region 506 is negligible, resulting in effectively no strain imparted to channel region 506.

Figure 5B:
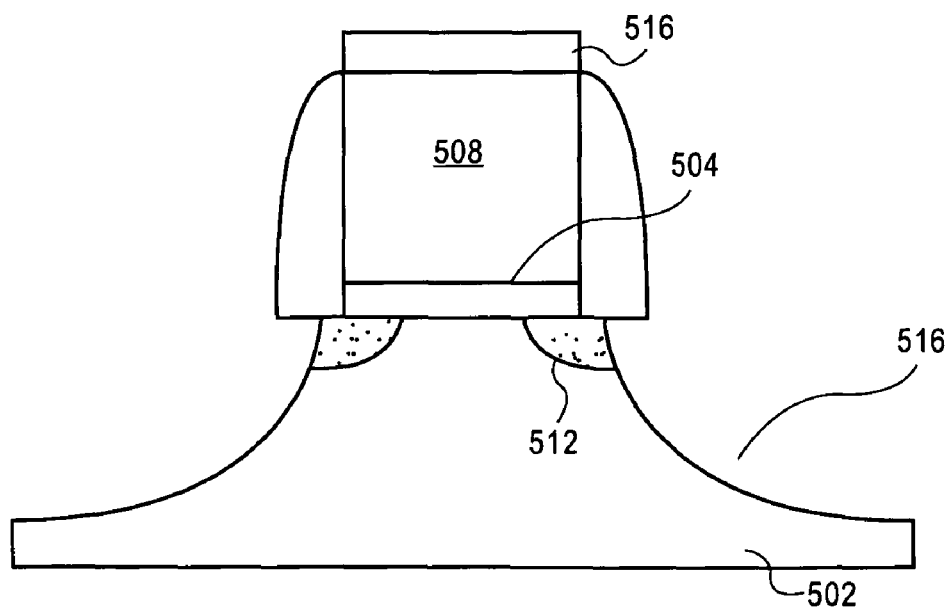

Referring to FIG. 5B, portions of substrate 502, including sacrificial source/drain regions 514, are removed to form etched-out regions 516 in substrate 502. Etched-out regions 516 may be formed by any technique discussed in association with the formation of etched-out region 416 from FIG. 4B. In accordance with an embodiment of the present invention, etched-out regions 516 are formed without significantly impacting gate dielectric layer 504, gate electrode 508, gate protection layer 516 or tip extensions 512. In one embodiment, etched-out region 516 is formed to a depth sufficient to remove the charge-carrier dopant impurities implanted to form sacrificial source/drain regions 514, as depicted in FIG. 5B.

Figure 5C:
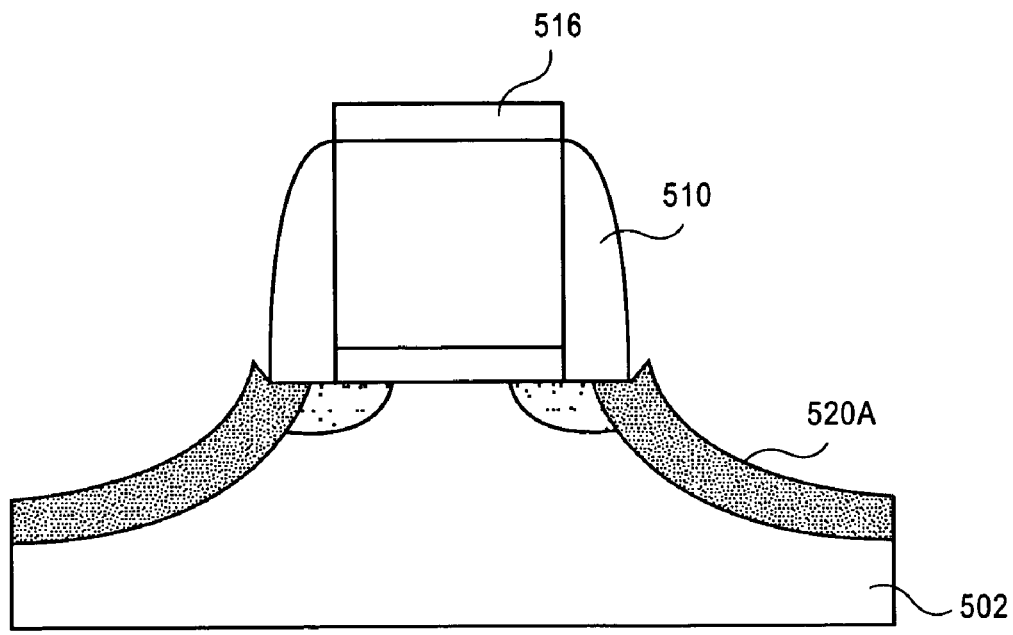

Referring to FIG. 5C, first portions 520A of two-component strain-inducing source/drain regions are formed in etched-out regions 516 of substrate 502. First portions 520A may be comprised of any material and may be formed by any method discussed in association with first portion 420A from FIG. 4C. In accordance with an embodiment of the present invention, first portions 520A are deposited selectively on exposed surfaces of substrate 502, but not on the high polarity dielectric surfaces of gate isolation spacers 510 or gate protection layer 516, as depicted in FIG. 5C. Additionally, first portions 520A may be faceted, also depicted in FIG. 5C.

Figure 5D:
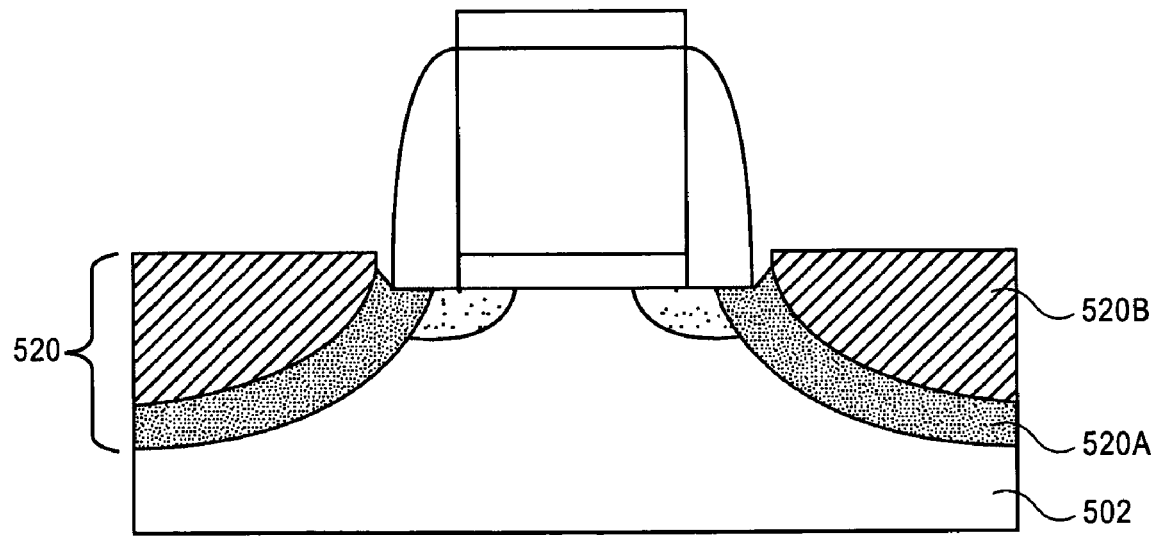

Referring to FIG. 5D, second portions 520B of two-component strain-inducing source/drain regions 520 are formed directly above first portions 520A, which are between second portions 520B and substrate 502. Second portions 520B may be comprised of any material and may be formed by any method discussed in association with second portion 520B from FIG. 4D. In accordance with an embodiment of the present invention, second portions 520B are deposited selectively on exposed surfaces of first portions 520A, but not on the high polarity dielectric surfaces of gate isolation spacers 510 or gate protection layer 516, as depicted in FIG. 5D. Additionally, the top surfaces of second portions 520B may be raised above the top surface of substrate 502, as is also depicted in FIG. 5D.

Figure 5E:
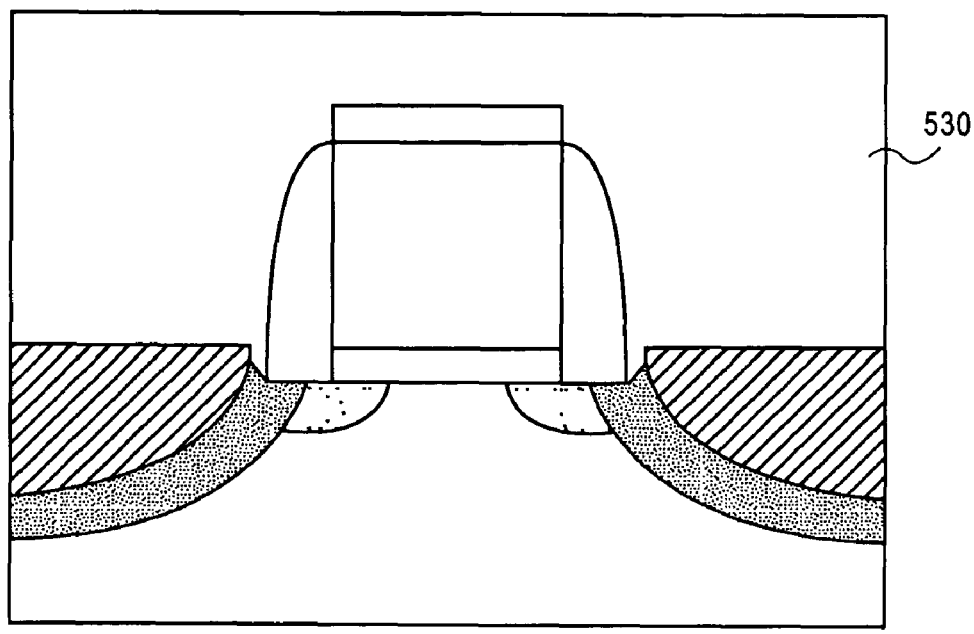
Figure 5F:
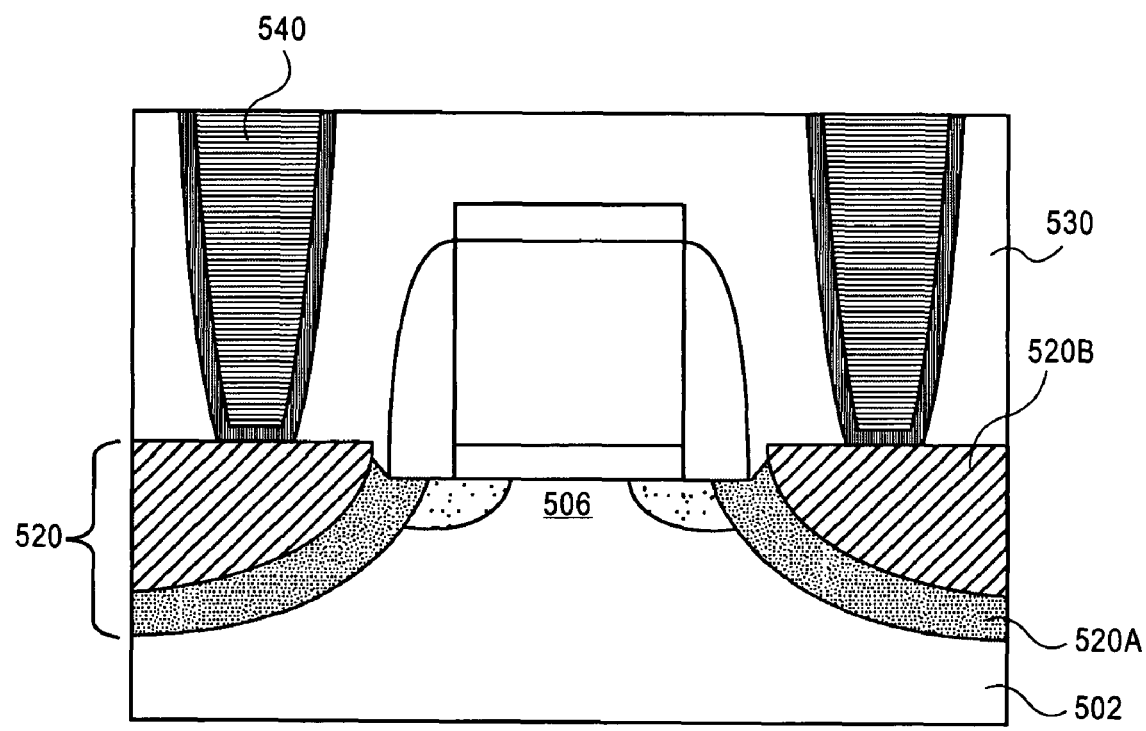

The structure described in association with FIG. 5D may then undergo typical process steps to complete the formation of a MOS-FET, such as a silicidation and/or metallization step of the second portions 520B (although this step may be carried out following contact formation, as described below) and encapsulation by an inter-layer dielectric layer 530 (shown in FIG. 5E). Referring to FIG. 5F, metal contacts 540 are formed in inter-layer dielectric layer 530, landing on two-component strain-inducing source/drain regions 520. Thus, contact may be made to the second portion 520B of two-component strain-inducing source/drain region 520, while the first portion 520A of two-component strain-inducing source/drain region 520 is adjacent channel region 506. In accordance with an embodiment of the present invention, second portion 520B of two-component strain-inducing source/drain region 520 has a higher concentration of charge-carrier dopant impurity atoms that first portion 520A. Thus, contact may be made at a region of higher dopant concentration, enabling an improved (i.e. lowered) external resistance, while the channel region is adjacent a region of lower dopant concentration, enabling improved (i.e. mitigated diffusion) short-channel characteristics. In one embodiment, metal contact 540 is comprised of a liner metal layer and a fill metal layer, as depicted in FIG. 5F. In one embodiment, the liner metal layer is comprised of a metal selected from the group consisting of W, Ni, Co, Mo or Pt. In a specific embodiment, an anneal step is carried out following the formation of metal contact 540 in order to metallize a portion of second portions 520B.

Thus, a method to form a MOS-FET device comprising multi-component strain-inducing source/drain regions 520 has been described. In accordance with an embodiment of the present invention, two-component strain-inducing source/drain regions 520 impart a uniaxial strain to substrate 502 and, in turn, substrate 502 imparts a uniaxial strain to two-component strain-inducing source/drain regions 520. In one embodiment, the MOSFET device formed above is P-type (i.e. a PMOS-FET) having a compressively strained substrate 502 and, hence, a compressively strained channel region 506. Thus, a PMOS-FET with enhanced hole mobility may be formed. In another embodiment, the MOSFET device formed above is N-type (i.e. an NMOS-FET) having a tensile-strained substrate 502 and, hence, a tensile-strained channel region 506. Thus, an NMOS-FET with enhanced electron mobility may be formed. Such PMOS-FETs and NMOS-FETs may be incorporated into an integrated circuit by conventional process steps, as known in the art.

Figure 6:
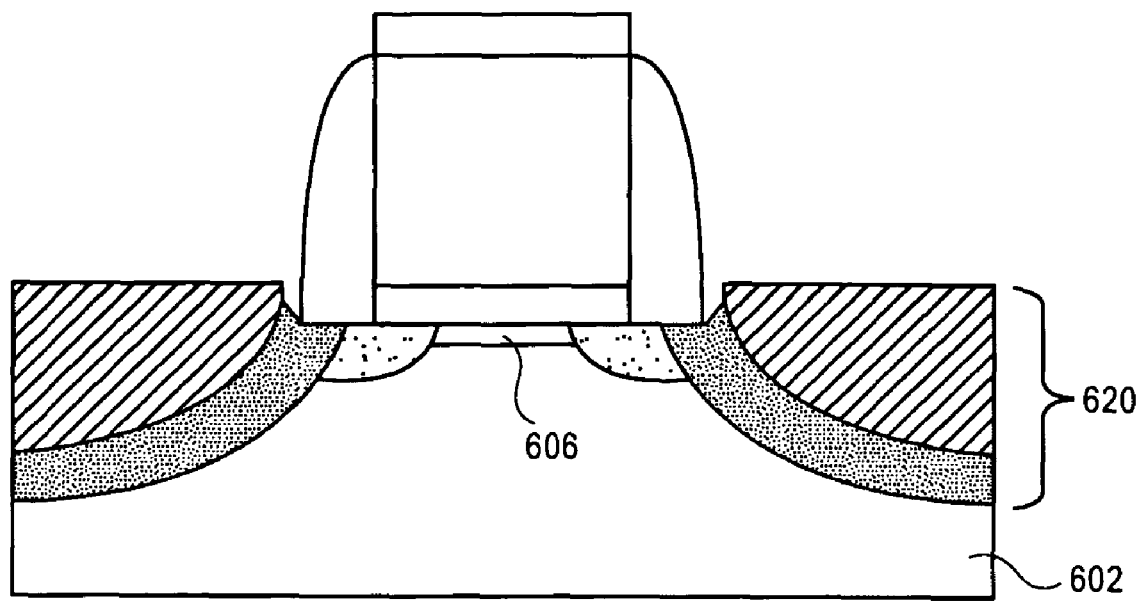
FIG. 6 illustrates a cross-sectional view of a MOS-FET incorporating multi-component strain-inducing source/drain regions and a strained channel layer, in accordance with an embodiment of the present invention.

The present invention is not limited to the formation of semiconductor devices with channel regions contained in the crystalline substrate. In accordance with an embodiment of the present invention, a uniaxial strain is imparted to an epitaxial layer directly above a strained substrate, wherein the epitaxial layer comprises a channel region. Thus, a multi-component strain-inducing semiconductor region may be used to impart strain to a channel region in a layer distinct from the strained substrate. FIG. 6 illustrates a cross-sectional view of a MOS-FET incorporating multi-component strain-inducing source/drain regions and a distinct strained channel layer, in accordance with an embodiment of the present invention.

Referring to FIG. 6, a MOSFET may comprise a channel layer 606. Channel layer 606 may be comprised of any material suitable to allow charge carriers to migrate from a source region to a drain region when a MOS-FET or related device is in an ON state. In one embodiment, channel layer 606 comprises an epitaxial layer of silicon, germanium or silicon/germanium. In another embodiment, channel layer 606 comprises a III-V material.

In accordance with an embodiment of the present invention, two-component strain-inducing source/drain regions 620 impart a uniaxial strain to substrate 602 and, in turn, substrate 602 imparts a uniaxial strain to two-component strain-inducing source/drain regions 620. In one embodiment, the MOSFET device is a PMOS-FET having a compressively strained substrate 602 and, hence, a compressively strained channel layer 606. In another embodiment, the MOSFET device is an NMOS-FET having a tensile-strained substrate 602 and, hence, a tensile-strained channel layer 606.

Figure 7:
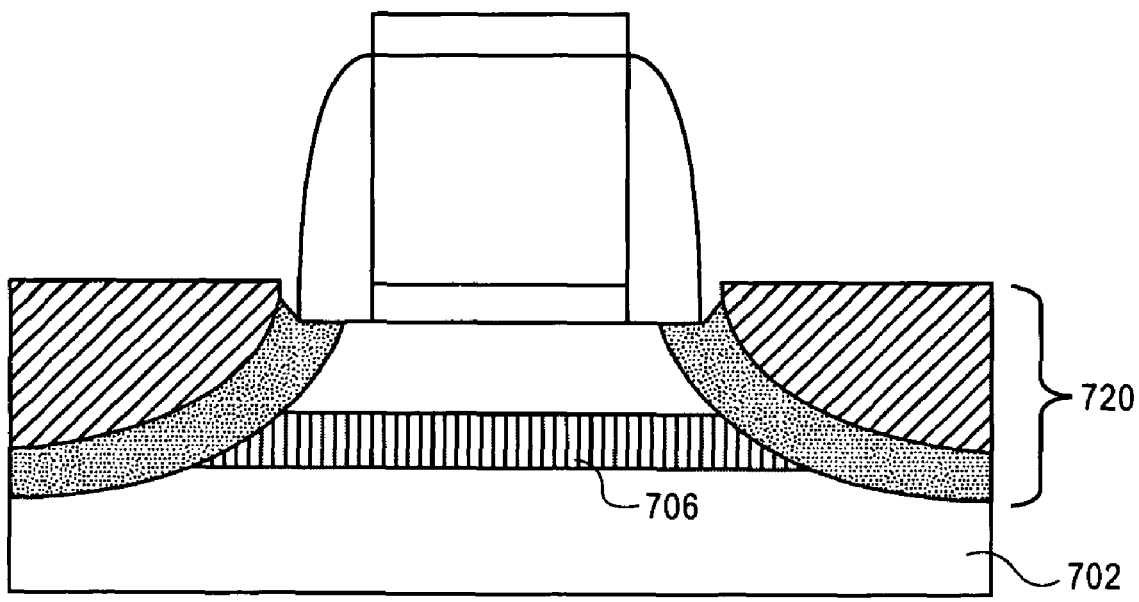
FIG. 7 illustrates a cross-sectional view of a MOS-FET incorporating multi-component strain-inducing source/drain regions and a strained quantum well, in accordance with an embodiment of the present invention.

A multi-component strain-inducing semiconductor region may also impart a strain to a region contained within, yet not at the surface of, a crystalline substrate. In accordance with an embodiment of the present invention, a uniaxial strain is imparted to a quantum well (e.g. a buried channel) within a strained substrate. FIG. 7 illustrates a cross-sectional view of a MOS-FET incorporating multi-component strain-inducing source/drain regions and a strained quantum well, in accordance with an embodiment of the present invention.

Referring to FIG. 7, a MOSFET may comprise a quantum well 706. Quantum well 706 may be comprised of any material suitable to allow charge carriers to migrate from a source region to a drain region when a MOS-FET or related device is in an ON state. In one embodiment, quantum well 706 comprises an epitaxial layer of silicon, germanium or silicon/germanium. In another embodiment, quantum well 706 comprises a III-V material.

In accordance with an embodiment of the present invention, two-component strain-inducing source/drain regions 720 impart a uniaxial strain to substrate 702 and, in turn, substrate 702 imparts a uniaxial strain to two-component strain-inducing source/drain regions 720. In one embodiment, the MOSFET device is a PMOS-FET having a compressively strained substrate 702 and, hence, a compressively strained quantum well 706. In another embodiment, the MOSFET device is an NMOS-FET having a tensile-strained substrate 702 and, hence, a tensile-strained quantum well 706.

The present invention is not limited to the formation of planar MOS-FETs comprising multi-component strain-inducing source/drain regions. For example, devices with a three-dimensional architecture, such as tri-gate devices, may benefit from the above process. As an exemplary embodiment, in accordance with the present invention, FIGS. 8A-D illustrate cross-sectional views representing the formation of multi-component strain-inducing source/drain regions in a tri-gate device.

Figure 8A:
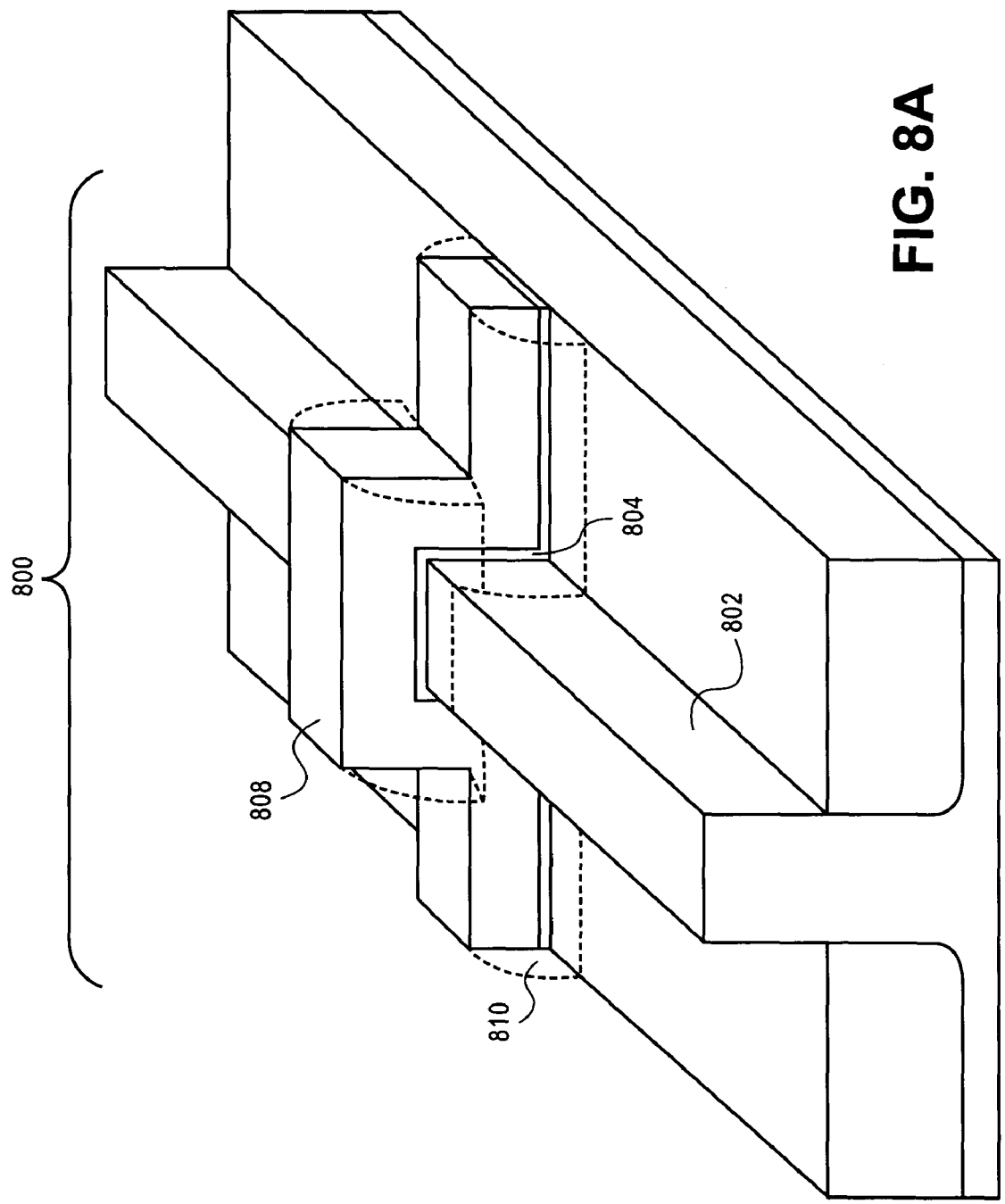

Referring to FIG. 8A, the foundation of a bulk-substrate tri-gate MOS-FET 800 is formed. Tri-gate MOS-FET 800 is comprised of a three-dimensional substrate 802. Three-dimensional substrate 802 may be formed from any material described in association with substrate 302 from FIG. 3. A gate dielectric layer 806 is formed around three-dimensional substrate 802 and a gate electrode 808 is formed above gate dielectric layer 804. Gate dielectric layer 804 and gate electrode 808 are protected by a pair of gate isolation spacers 810. Gate dielectric layer 804, gate electrode 808 and gate isolation spacers 810 may be comprised of any material discussed in association with gate dielectric layer 304, gate electrode 308 and gate isolation spacers 310 from FIG. 3.

Figure 8C:
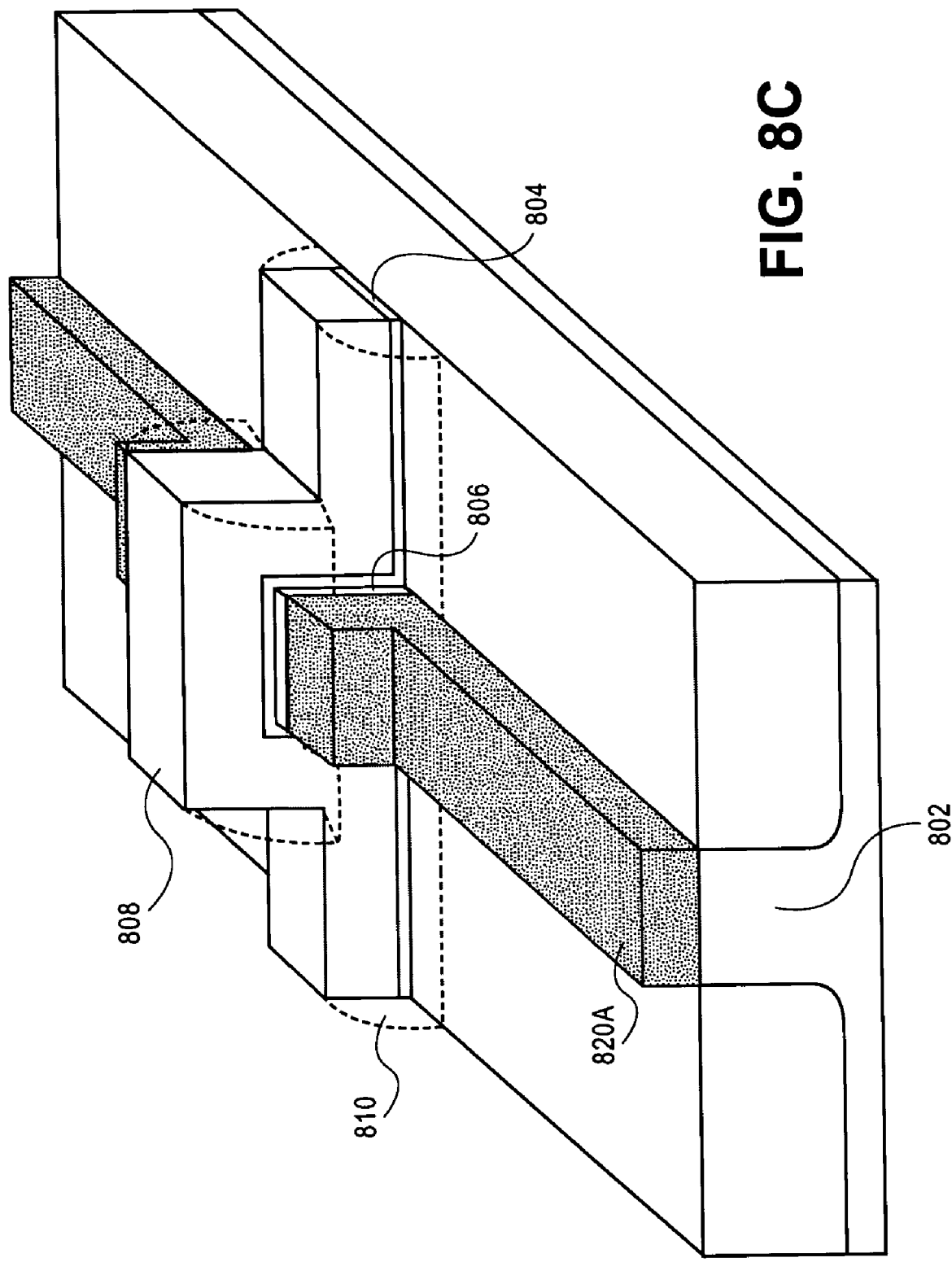

Referring to FIG. 8B, portions of three-dimensional substrate 802 are removed, leaving channel region 806. Referring to FIG. 8C, first portions 820A of multi-component strain-inducing source/drain regions are formed above substrate 802 and adjacent to three-dimensional channel region 806. First portions 820A may be comprised of any material and formed from any method described in association with first portion 420A from FIG. 4.

Figure 8D:
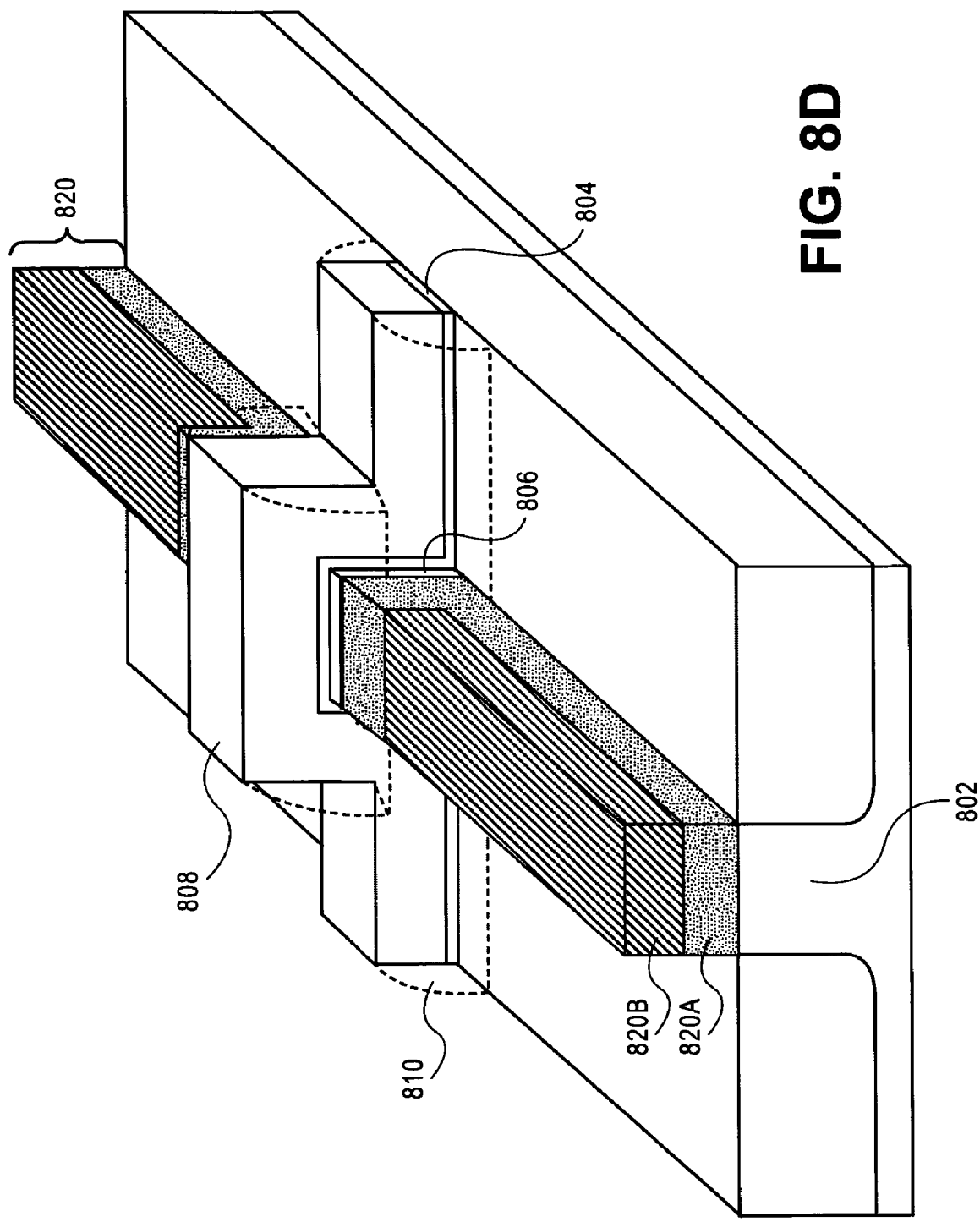

Referring to FIG. 8D, second portions 820B of two-component strain-inducing source/drain regions 820 are formed above first portions 820A, which are between three-dimensional channel region 806 and second portions 820B. Second portions 820B may be comprised of any material and formed from any method described in association with second portion 420B from FIG. 4. Therefore, a method to form a tri-gate MOS-FET device comprising two-component strain-inducing source/drain regions has been described. The tri-gate MOS-FET may be incorporated into an integrated circuit by conventional processing steps, as known in the art.

Thus, a multi-component strain-inducing semiconductor region has been disclosed. Formation of such a strain-inducing semiconductor region laterally adjacent to a crystalline substrate may result in a uniaxial strain imparted to the crystalline substrate, providing a strained crystalline substrate. In accordance with an embodiment of the present invention, the multi-component strain-inducing material region comprises a first portion and a second portion which are separated by an interface. In a specific embodiment, the concentration of charge-carrier dopant impurity atoms of the two portions are different from one another at the interface. It should be understood that although the details of the various embodiments disclosed herein are with respect to two-component strain-inducing material regions, more than two components may be used.

What is claimed is:

1. A method of fabricating a semiconductor device comprising:
   forming a gate dielectric layer above a substrate;
   forming a gate electrode above said gate dielectric layer;
   forming a pair of tip extensions on either side of said gate electrode and in said substrate, wherein said pair of tip extensions defines a channel region in said substrate;
   forming a pair of gate isolation spacers on either side of said gate electrode and above said pair of tip extensions;
   removing a portion of said substrate on either side of said pair of gate isolation spacers to form a pair of etched-out regions in said substrate;
   forming a first portion of a pair of source/drain regions in said pair of etched-out regions; and
   forming a second portion of said pair of source/drain regions in said pair of etched-out regions directly above said first portion to form an interface between said second portion and said first portion, wherein the lattice constants of said first and said second portions are different from the lattice constant of said channel region, wherein said pair of source/drain regions imparts a strain to said channel region, wherein said channel region imparts a strain to said pair of source/drain regions, wherein the concentration of charge-carrier dopant impurity atoms of said second portion at said interface is greater than the concentration of charge-carrier dopant impurity atoms of said first portion at said interface by a factor of at least two, wherein said channel region has a first conductivity type, wherein said pair of source/drain regions has a second conductivity type, and wherein said first conductivity type is different from said second conductivity type.

2. The method of claim 1 wherein the concentration of charge-carrier dopant impurity atoms in said first portion is in the range of $1 \times 10^{18}$-$1 \times 10^{20}$ atoms/cm$^3$ and in said second portion is in the range of $5 \times 10^{20}$-$5 \times 10^{21}$ atoms/cm$^3$.

3. The method of claim 2 wherein said channel region is comprised of silicon atoms with a total atomic concentration greater than 99% and charge-carrier dopant impurity atoms selected from the group consisting of phosphorus, arsenic or antimony, and wherein said pair of source/drain regions is comprised of silicon/germanium and charge-carrier dopant impurity atoms selected from the group consisting of boron or indium.

4. The method of claim 3 wherein the concentration of germanium atoms in said second portion is at least 10% greater than the concentration of germanium atoms in said first portion.

5. The method of claim 2 wherein said channel region is comprised of silicon atoms with a total atomic concentration greater than 99% and charge-carrier dopant impurity atoms selected from the group consisting of boron or indium, and wherein said pair of source/drain regions is comprised of carbon-doped silicon and charge-carrier dopant impurity atoms selected from the group consisting of phosphorus, arsenic or antimony.

6. The method of claim 5 wherein the concentration of carbon atoms in said second portion is at least 10% greater than the concentration of carbon atoms in said first portion.

7. The method of claim 2 wherein said substrate is comprised of a III-V material and charge-carrier dopant impurity atoms selected from the group consisting of carbon, silicon or germanium, and wherein said pair of source/drain regions is comprised of a III-V material and charge-carrier dopant impurity atoms selected from the group consisting of oxygen, sulfur, selenium or tellurium.

8. The method of claim 1 wherein said pair of source/drain regions imparts a uniaxial strain to said channel region, and wherein said channel region imparts a uniaxial strain to said pair of source/drain regions.

9. The method of claim 8 wherein the lattice constants of said first and second portions are different from the lattice constant of said channel region by factors of at least 0.2%.

10. A method of fabricating a semiconductor device comprising:
    forming a gate dielectric layer above a substrate;
    forming a gate electrode above said gate dielectric layer;
    forming a pair of tip extensions on either side of said gate electrode and in said substrate, wherein said pair of tip extensions defines a channel region in said substrate;
    forming a pair of gate isolation spacers on either side of said gate electrode and above said pair of tip extensions;

removing a portion of said substrate on either side of said pair of gate isolation spacers to form a pair of etched-out regions in said substrate;

forming a first portion of a pair of source/drain regions in said pair of etched-out regions; and forming a second portion of said pair of source/drain regions in said pair of etched-out regions directly above said first portion to form an interface between said second portion and said first portion, wherein the lattice constants of said first and said second portions are different from one another, wherein the effective lattice constant of said first and said second portions is different from the lattice constant of said channel region, wherein said pair of source/drain regions imparts a strain to said channel region, wherein said channel region imparts a strain to said pair of source/drain regions, wherein the concentration of charge-carrier dopant impurity atoms of said second portion at said interface is greater than the concentration of charge-carrier dopant impurity atoms of said first portion at said interface by a factor of at least two, wherein said channel region has a first conductivity type, wherein said pair of source/drain regions has a second conductivity type, and wherein said first conductivity type is different from said second conductivity type.

11. The method of claim 10 wherein the concentration of charge-carrier dopant impurity atoms in said first portion is in the range of $1\times10^{18}$-$1\times10^{20}$ atoms/cm$^3$ and in said second portion is in the range of $5\times10^{20}$-$5\times10^{21}$ atoms/cm$^3$.

12. The method of claim 11 wherein said channel region is comprised of silicon atoms with a total atomic concentration greater than 99% and charge-carrier dopant impurity atoms selected from the group consisting of phosphorus, arsenic or antimony, and wherein said pair of source/drain regions is comprised of silicon/germanium and charge-carrier dopant impurity atoms selected from the group consisting of boron or indium.

13. The method of claim 12 wherein the concentration of germanium atoms in said second portion is at least 10% greater than the concentration of germanium atoms in said first portion.

14. The method of claim 11 wherein said channel region is comprised of silicon atoms with a total atomic concentration greater than 99% and charge-carrier dopant impurity atoms selected from the group consisting of boron or indium, and wherein said pair of source/drain regions is comprised of carbon-doped silicon and charge-carrier dopant impurity atoms selected from the group consisting of phosphorus, arsenic or antimony.

15. The method of claim 14 wherein the concentration of carbon atoms in said second portion is at least 10% greater than the concentration of carbon atoms in said first portion.

16. The method of claim 11 wherein said substrate is comprised of a III-V material and charge-carrier dopant impurity atoms selected from the group consisting of carbon, silicon or germanium, and wherein said pair of source/drain regions is comprised of a III-V material and charge-carrier dopant impurity atoms selected from the group consisting of oxygen, sulfur, selenium or tellurium.

17. The method of claim 10 wherein said pair of source/drain regions imparts a uniaxial strain to said channel region, and wherein said channel region imparts a uniaxial strain to said pair of source/drain regions.

18. The method of claim 17 wherein the effective lattice constant of said first and said second portions is different from the lattice constant of said channel region by a factor of at least 0.2%.

* * * * *